(12) United States Patent
Imai et al.

(10) Patent No.: US 7,825,518 B2
(45) Date of Patent: Nov. 2, 2010

(54) SEMICONDUCTOR DEVICE AND METHOD OF MANUFACTURING THE SAME

(75) Inventors: Hideo Imai, Shimosuwa (JP); Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/685,169

(22) Filed: Jan. 11, 2010

(65) Prior Publication Data

US 2010/0109144 A1    May 6, 2010

Related U.S. Application Data

(62) Division of application No. 11/444,271, filed on May 31, 2006, now Pat. No. 7,671,476.

(30) Foreign Application Priority Data

Jun. 29, 2005    (JP)    ............... 2005-190448

(51) Int. Cl.
*H01L 23/52*    (2006.01)
(52) U.S. Cl. .............. 257/775; 257/784; 257/786; 257/E23.015
(58) Field of Classification Search ............ 257/773, 257/775, 784, 786, E23.015, E23.02
See application file for complete search history.

(56) References Cited

U.S. PATENT DOCUMENTS

| 6,720,591 | B2 | 4/2004 | Miyamoto et al. |
| 6,949,416 | B2 | 9/2005 | Miyamoto et al. |
| 2005/0139371 | A1 | 6/2005 | Ishimaru et al. |
| 2005/0236104 | A1 | 10/2005 | Tanaka |
| 2005/0275115 | A1 | 12/2005 | Tanaka |

FOREIGN PATENT DOCUMENTS

| JP | 02-272737 | 11/1990 |
| JP | 11-067776 | 3/1999 |
| JP | 2002-237546 | 8/2002 |
| JP | 2002-319635 | 10/2002 |
| JP | 2005-101527 | 4/2005 |
| JP | 2005-109110 | 4/2005 |
| JP | 2005-136402 | 5/2005 |
| JP | 2005-310815 | 11/2005 |
| JP | 2005-340761 | 12/2005 |
| JP | 2005-353983 | 12/2005 |

*Primary Examiner*—Matthew E Warren
(74) *Attorney, Agent, or Firm*—Harness, Dickey & Pierce, P.L.C.

(57) ABSTRACT

A semiconductor device including: a semiconductor substrate including an electrode; a resin protrusion formed on the semiconductor substrate; and an interconnect electrically connected to the electrode and formed to extend over the resin protrusion. The interconnect includes a first portion formed on a top surface of the resin protrusion and a second portion formed on a side of a lower portion of the resin protrusion. The second portion has a width smaller than a width of the first portion.

10 Claims, 5 Drawing Sheets

SEMICONDUCTOR DEVICE AND METHOD OF MANUFACTURING THE SAME

CROSS-REFERENCE TO RELATED APPLICATIONS

This is a divisional application of U.S. Ser. No. 11/444,271 filed May 31, 2006, claiming priority to Japanese Patent Application No. 2005-190448, filed on Jun. 29, 2005, all of which are hereby incorporated by reference in their entireties.

BACKGROUND OF THE INVENTION

The present invention relates to a semiconductor device and a method of manufacturing the same.

In order to reduce the size of electronic parts, it is preferable that the external shape of the semiconductor device be small. Along with diversification of the functions of semiconductor devices, the degree of integration of an integrated circuit formed on a semiconductor chip has been increased. Therefore, the number of pins of the semiconductor chip has been increased. Specifically, a semiconductor device has been developed which allows a reduction in size of the semiconductor device and an increase in the degree of integration of the integrated circuit.

As a semiconductor device which can satisfy such demands, a semiconductor device in which an interconnect is formed on a semiconductor chip has attracted attention (see JP-A-2-272737). In this type of semiconductor device, since the external shape of the semiconductor device can be made approximately equal to the external shape of the semiconductor chip, the size of the semiconductor device can be reduced.

The above semiconductor device is required to exhibit high reliability. In addition, a method of efficiently manufacturing the above semiconductor device while ensuring reliability has been demanded.

SUMMARY

According to a first aspect of the invention, there is provided a semiconductor device comprising:
  a semiconductor substrate including an electrode;
  a resin protrusion formed on the semiconductor substrate; and
  an interconnect electrically connected to the electrode and formed to extend over the resin protrusion, the interconnect including a first portion formed on a top surface of the resin protrusion and a second portion formed on a side of a lower portion of the resin protrusion, and the second portion having a width smaller than a width of the first portion.

According to a second aspect of the invention, there is provided a method of manufacturing a semiconductor device comprising:
  providing a semiconductor substrate having an electrode;
  forming a resin protrusion on the semiconductor substrate;
  forming an interconnect which is electrically connected to the electrode and includes a first portion formed on a top surface of the resin protrusion and a second portion formed on a lower portion of the resin protrusion and having a width smaller than a width of the first portion; and
  removing at least part of a portion of the lower portion of the resin protrusion which contacts the second portion.

DETAILED DESCRIPTION OF THE EMBODIMENT

The invention may provide a highly reliable semiconductor device and a method of manufacturing the same.

(1) According to one embodiment of the invention, there is provided a semiconductor device comprising:
  a semiconductor substrate including an electrode;
  a resin protrusion formed on the semiconductor substrate; and
  an interconnect electrically connected to the electrode and formed to extend over the resin protrusion, the interconnect including a first portion formed on a top surface of the resin protrusion and a second portion formed on a side of a lower portion of the resin protrusion, and the second portion having a width smaller than a width of the first portion.

In this embodiment, a highly reliable semiconductor device can be provided in which an electrical short circuit due to migration rarely occurs between two adjacent interconnects.

(2) In this semiconductor device,
  the interconnect may include an extension portion extending from the second portion, and a conductive portion connecting the extension portion and the electrode; and
  the extension portion may have a width smaller than a width of the conductive portion.

(3) In this semiconductor device, the extension portion may have a width equal to the width of the second portion.

(4) In this semiconductor device, a portion of the interconnect formed on the semiconductor substrate may have a width equal to the width of the second portion.

(5) In this semiconductor device, the second portion of the interconnect may not be secured to the resin protrusion.

This allows a semiconductor device exhibiting high reliability against stress can be provided.

(6) According to one embodiment of the invention, there is provided a method of manufacturing a semiconductor device comprising:
  providing a semiconductor substrate having an electrode;
  forming a resin protrusion on the semiconductor substrate;
  forming an interconnect which is electrically connected to the electrode and includes a first portion formed on a top surface of the resin protrusion and a second portion formed on a lower portion of the resin protrusion and having a width smaller than a width of the first portion; and removing at least part of a portion of the lower portion of the resin protrusion which contacts the second portion.

In this embodiment, a highly reliable semiconductor device can be provided in which an electrical short circuit due to migration rarely occurs between two adjacent interconnects and which exhibits high reliability against stress.

The embodiments of the invention will be described below, with reference to the drawings. Note that the invention is not limited to the following embodiments.

Semiconductor Device

Figure 1A:
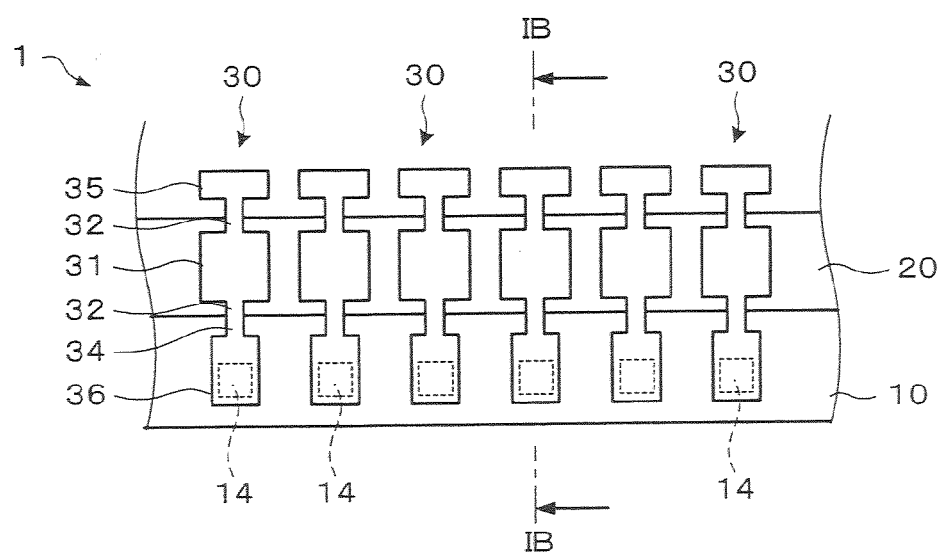
FIGS. 1A and 1B are views illustrative of a semiconductor device according to one embodiment of the invention.
Figure 1B:
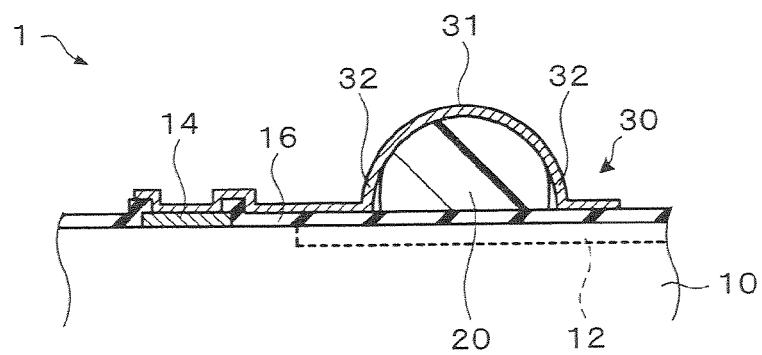
Figure 2:
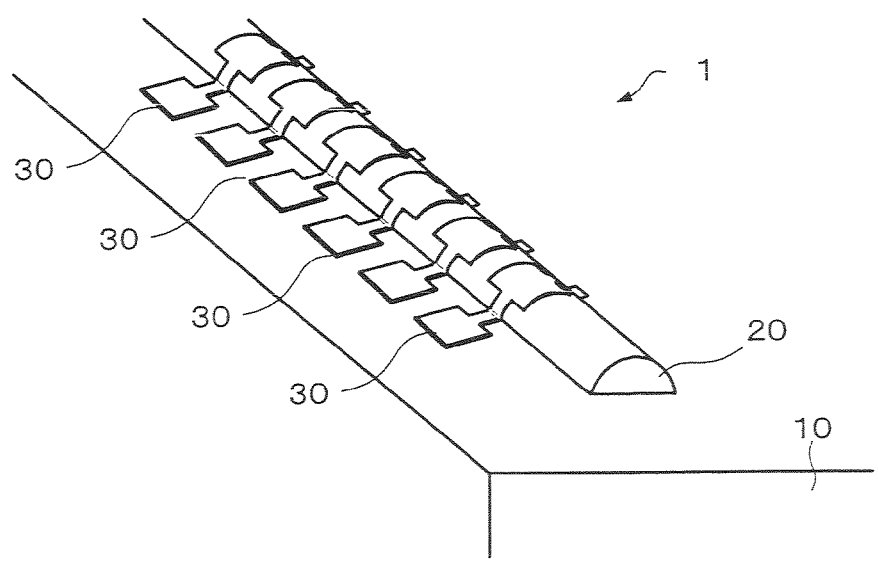
FIG. 2 is a view illustrative of a semiconductor device according to one embodiment of the invention.
Figure 3:
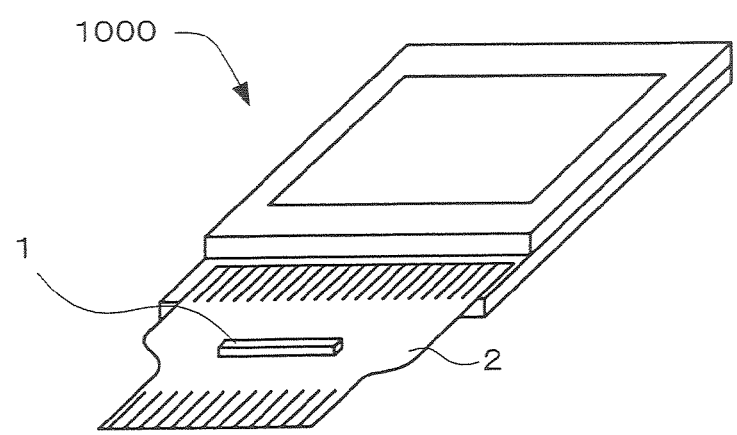
FIG. 3 is a view showing an electronic module on which a semiconductor device according to one embodiment of the invention is mounted.

FIGS. 1 to 3 are views illustrative of a semiconductor device according to one embodiment of the invention. FIG. 1A is a top view of a semiconductor device 1 according to one embodiment of the invention, and FIG. 1B is a partially enlarged view of the cross section along the line IB-IB shown in FIG. 1A. FIG. 2 is a schematic view of the semiconductor device 1, and FIG. 3 is a view showing an electronic module on which the semiconductor device 1 is mounted.

As shown in FIGS. 1A to 2, the semiconductor device according to this embodiment includes a semiconductor substrate 10. The semiconductor substrate 10 may be a silicon substrate, for example. The semiconductor substrate 10 may be in the shape of a chip (see FIG. 3). The surface (active surface) of the semiconductor substrate 10 on which an electrode 14 is formed may be rectangular. The active surface of the semiconductor substrate 10 may be square (not shown). Or, the semiconductor substrate 10 may be in the shape of a wafer (see FIG. 4A). One or more integrated circuits 12 may be formed on the semiconductor substrate 10 (one integrated circuit 12 may be formed on a semiconductor chip and two or more integrated circuits 12 may be formed on a semiconductor wafer) (see FIG. 1B). The configuration of the integrated circuit 12 is not particularly limited. For example, the integrated circuit 12 may include an active element such as a transistor and a passive element such as a resistor, coil, or capacitor.

As shown in FIGS. 1A and 1B, the semiconductor substrate 10 includes the electrode 14. The electrode 14 may be electrically connected with the inside of the semiconductor substrate 10. The electrode 14 may be electrically connected with the integrated circuit 12. The electrode 14 may also include a conductor which is not electrically connected with the integrated circuit 12. The electrode 14 may be part of an internal interconnect of the semiconductor substrate. The electrode 14 may be a portion of the internal interconnect of the semiconductor substrate used for electrical connection with the outside. The electrode 14 may be formed of a metal such as aluminum or copper.

As shown in FIG. 1B, the semiconductor substrate 10 may include a passivation film 16. The passivation film 16 may be formed to expose the electrode 14. The passivation film 16 may have an opening which exposes the electrode 14. The passivation film 16 may be formed to partially cover the electrode 14. The passivation film 16 may be formed to cover the periphery of the electrode 14. The passivation film may be an inorganic insulating film formed of $SiO_2$, SiN, or the like. The passivation film 16 may be an organic insulating film formed of a polyimide resin or the like.

As shown in FIGS. 1A to 2, the semiconductor device according to this embodiment includes a resin protrusion 20 formed on the semiconductor substrate 10. The resin protrusion 20 may be formed on the passivation film 16. The material for the resin protrusion 20 is not particularly limited. A known material may be used. For example, the resin protrusion 20 may be formed using a resin such as a polyimide resin, silicone-modified polyimide resin, epoxy resin, silicone-modified epoxy resin, benzocyclobutene (BCB), or polybenzoxazole (PBO). The shape of the resin protrusion 20 is not particularly limited. For example, the resin protrusion 20 may be formed linearly (see FIGS. 1A and 2). When the semiconductor substrate 10 is rectangular, the resin protrusion 20 may be formed to extend along the long side of the semiconductor substrate 10. The surface of the resin protrusion 20 may be curved. In this case, the cross-sectional shape of the resin protrusion 20 may be a semicircle (see FIG. 1B). The resin protrusion 20 may have a hemispherical shape (not shown).

As shown in FIGS. 1A to 2, the semiconductor device according to this embodiment includes an interconnect 30. The interconnect 30 is electrically connected with the electrode 14. The interconnect 30 is formed to extend over the resin protrusion 20. The interconnect 30 includes a first portion 31 formed on the top surface of the resin protrusion 20, and a second portion 32 formed on the side of the lower portion of the resin protrusion 20. As shown in FIGS. 1A and 2, the second portion 32 has a width smaller than that of the first portion 31. The first portion 31 may be secured to the resin protrusion 20. On the other hand, the second portion 32 may not be secured to the surface of the lower portion of the resin protrusion 20. As shown in FIG. 1B, the second portion 32 may be formed at an interval from the resin protrusion 20. Note that the second portion 32 may be secured to the resin protrusion 20 (see FIG. 7). The second portion 32 may be provided on each side of the resin protrusion 20.

As shown in FIG. 1A, the interconnect 30 may include an extension portion 34 extending to the second portion 32, and a conductive portion 36 which connects the extension portion 34 and the electrode 14. The extension portion 34 and the conductive portion 36 may be portions provided on the semiconductor substrate 10 (passivation film 16). The first and second portions 31 and 32 may be electrically connected with the electrode 14 through the conductive portion 36 and the extension portion 34. The extension portion 34 may have a width smaller than that of the conductive portion 36. The extension portion 34 may have a width equal to that of the second portion 32. An end portion 35 of the interconnect 30 may have a width greater than that of the second portion 32. This allows the contact area between the interconnect 30 and the semiconductor substrate 10 (passivation film 16) to be increased. Therefore, a highly reliable semiconductor device can be provided in which separation of the interconnect 30 rarely occurs.

Note that the interconnect 30 is not limited thereto. The portion of the interconnect 30 formed on the semiconductor substrate 10 may have a constant width (not shown). The portion of the interconnect 30 formed on the semiconductor substrate 10 may have a width equal to that of the second portion 32.

The structure and the material of the interconnect 30 are not particularly limited. For example, the interconnect 30 may be formed by a plurality of layers. In this case, the interconnect 30 may include a first layer formed of titanium tungsten and a second layer formed of gold (not shown). Or, the interconnect 30 may be formed by a single layer.

The semiconductor device 1 according to this embodiment may have the above-described configuration. As described above, the interconnect 30 includes the first portion 31 formed on the top surface of the resin protrusion 20, and the second portion 32 disposed on the side of the lower portion of the resin protrusion 20. The second portion 32 has a width smaller than that of the first portion 31. Therefore, the semiconductor device 1 allows the interval between the second portions 32 of two adjacent interconnects 30 to be increased. This prevents an electrical short circuit due to migration from occurring between the second portions 32 of the interconnects 30. This effect is described below in detail.

In the manufacture of the semiconductor device, a carbide layer may be formed on the surface of the resin protrusion 20. Since the carbide layer has an insulation resistance lower than that of the resin, an electrical short circuit tends to occur between two interconnects formed on the carbide layer in comparison with two interconnects formed on the resin layer. If the interconnects are scaled down and reduced in pitch, a decrease in the insulation resistance may affect the reliability of the semiconductor device.

A technology has been known in which the insulation resistance between interconnects is secured by removing a carbide layer between two adjacent interconnects in order to manufacture a highly reliable semiconductor device. For example, a resin layer between two adjacent interconnects is removed by $O_2$ plasma etching. However, the lower portion of the resin protrusion 20 has an angle of about 90° with respect to the semiconductor substrate 10. Therefore, it is difficult to efficiently and reliably remove the carbide layer formed on the surface of the lower portion of the resin protrusion 20 by a known method.

On the other hand, according to this embodiment, the second portion 32 of the interconnect 30 formed on the side of the lower portion of the resin protrusion 20 has a width smaller than that of the first portion 31. Therefore, the semiconductor device 1 allows the interval between the second portions 32 of two adjacent interconnects 30 to be increased. This prevents an electrical short circuit from occurring between two adjacent interconnects 30 even if the carbide layer is formed on the surface of the lower portion of the resin protrusion 20 (even if the carbide layer remains without being completely removed).

Note that the effects of deformation of the resin protrusion 20 on the second portion 32 can be reduced when the second portion 32 is not secured to the resin protrusion 20. Therefore, the second portion 32 can be prevented from breaking even if the width of the second portion 32 is reduced.

The first portion 31 of the interconnect 30 formed on the top surface of the resin protrusion 20 is the portion used for electrical connection with other electronic parts and the like. Therefore, it is preferable that the width of the first portion 31 be large in order to increase the mounting properties of the semiconductor device. The top surface of the resin protrusion 20 is almost parallel to the surface of the semiconductor substrate. Therefore, the carbide layer on the top surface of the resin protrusion 20 can be reliably removed by a known method. Specifically, an electrical short circuit rarely occurs between the first portions 31 of two adjacent interconnects 30 even if the interval between the first portions 31 is reduced.

Therefore, the semiconductor device according to this embodiment allows provision of a semiconductor device which exhibits excellent mounting properties and high electrical reliability.

FIG. 3 shows an electronic module 1000 on which the semiconductor device 1 is mounted. In the example shown in FIG. 3, the semiconductor device 1 is mounted on a substrate 2. The substrate 2 may be a flexible substrate, for example. The semiconductor device 1 may be mounted so that the surface on which the interconnect 30 is formed faces the substrate 2. An interconnect of the substrate 2 and the interconnect 30 of the semiconductor device 1 may contact each other and be electrically connected. In more detail, the interconnect of the substrate 2 and the first portion 31 of the interconnect 30 may contact each other and be electrically connected. This allows the interconnect 30 (first portion 31) to be pressed against the interconnect of the substrate 2 due to the elasticity of the resin protrusion 20. Therefore, an electronic module exhibiting high electrical connection reliability can be provided. The semiconductor device 1 may be bonded to the substrate 2 using an adhesive (resin-based adhesive). The electronic module 1000 may be a display device. The display device may be a liquid crystal display device or an electroluminescent (EL) display device. The semiconductor device 1 may be a driver IC which controls the display device.

Method of Manufacturing Semiconductor Device

FIGS. 4A to 7 are views illustrative of a method of manufacturing a semiconductor device according to one embodiment of the invention.

Figure 4A:
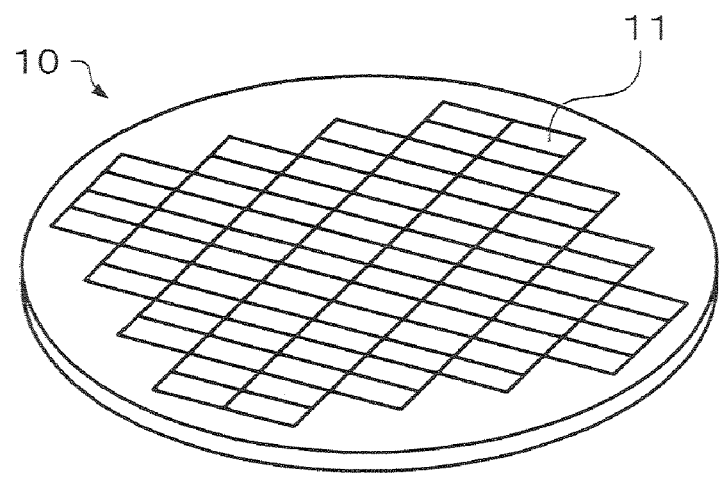
FIGS. 4A and 4B are views illustrative of a method of manufacturing a semiconductor device according to one embodiment of the invention.
Figure 4B:
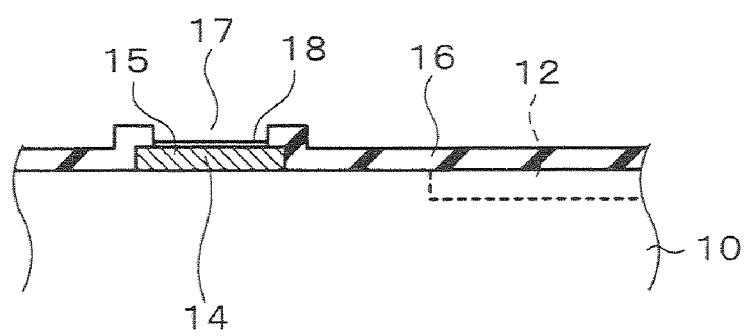

The method of manufacturing a semiconductor device according to this embodiment includes providing the semiconductor substrate 10 including the electrode 14 shown in FIGS. 4A and 4B. The semiconductor substrate 10 may be provided in the shape of a wafer, for example. As shown in FIG. 4A, the semiconductor substrate 10 in the shape of a wafer may include a plurality of areas 11 in which the semiconductor devices are respectively formed. As shown in FIG. 4B, the semiconductor substrate 10 may include the passivation film 16. An opening 17 may be formed in the passivation film 16. The semiconductor substrate 10 may include an oxide film 18. The oxide film 18 may be formed on the electrode 14. The oxide film 18 may be formed on the electrode 14 in the area in which the oxide film 18 overlaps the opening 17. As shown in FIG. 4B, the oxide film 18 may be formed inside the opening 17.

Figure 5A:
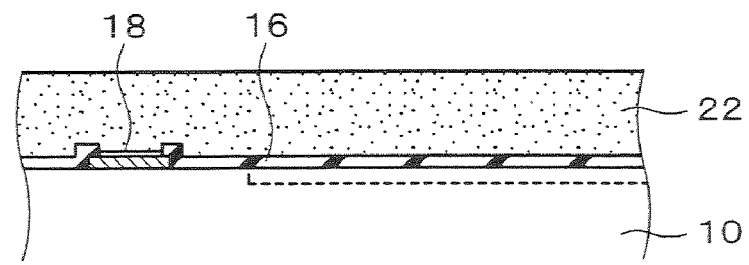
FIGS. 5A to 5C are views illustrative of a method of manufacturing a semiconductor device according to one embodiment of the invention.
Figure 5B:
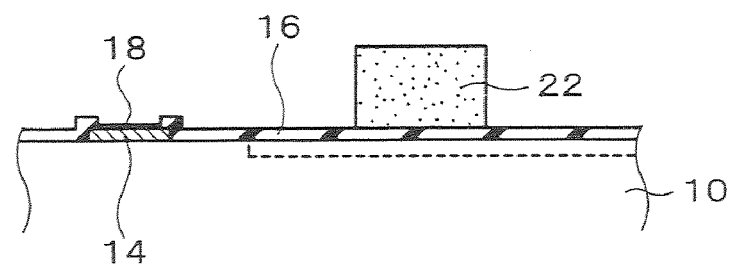
Figure 5C:
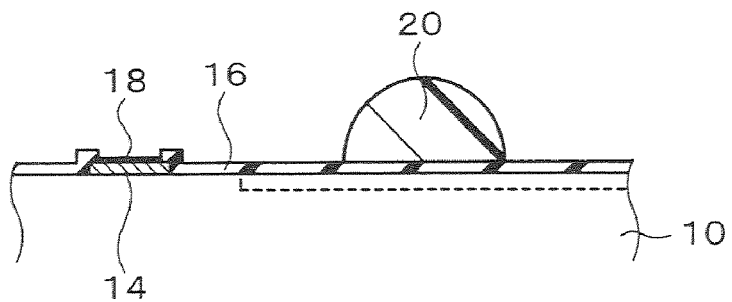

The method of manufacturing a semiconductor device according to this embodiment includes forming the resin protrusion 20 on the semiconductor substrate 10 (see FIG. 5C). The method of forming the resin protrusion 20 is not particularly limited. An example of the method of forming the resin protrusion 20 is described below with reference to FIGS. 5A to 5C. As shown in FIG. 5A, a resin material 21 is provided on the semiconductor substrate 10 (passivation film 16). As shown in FIG. 5B, the resin material 21 is patterned. The resin material 21 may be then cured (e.g. thermally cured) to form the resin protrusion 20, as shown in FIG. 5C. In the step of forming the resin protrusion 20, the resin material 21 may be melted and then cured to form the resin protrusion 20 having a curved surface.

Figure 6:
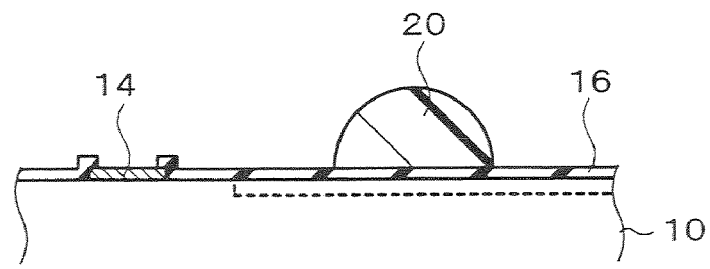
FIG. 6 is a view illustrative of a method of manufacturing a semiconductor device according to one embodiment of the invention.

The method of manufacturing a semiconductor device according to this embodiment may include removing at least part of the oxide film 18 to expose the electrode 14, as shown in FIG. 6. The surface of the top portion of the resin protrusion 20 may be carbonized by this step to form a carbide layer. This step may be performed using Ar gas. For example, this step may include disposing the semiconductor substrate 10 in an Ar gas atmosphere (atmosphere containing Ar ions), and accelerating the Ar ions utilizing the potential difference to cause the Ar ions to collide with the oxide film 18. In this case, the oxide film 18 may be scattered by causing the Ar ions to collide with the oxide film 18 to expose the electrode 14. This step may be performed using gas other than the Ar gas.

Figure 7:
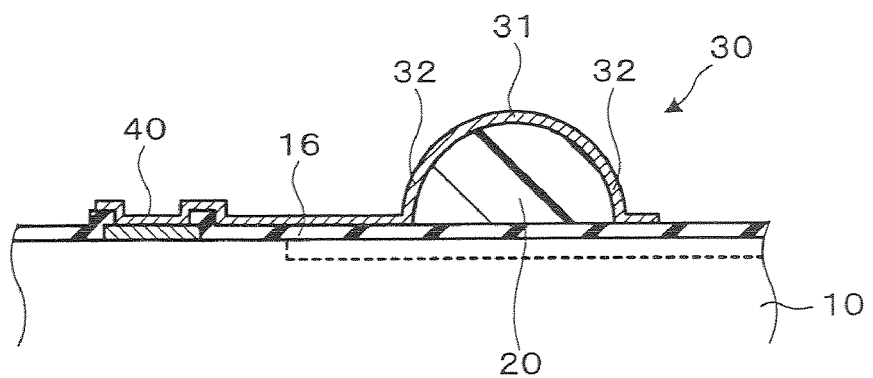
FIG. 7 is a view illustrative of a method of manufacturing a semiconductor device according to one embodiment of the invention.

The method of manufacturing a semiconductor device according to this embodiment includes forming the interconnect 30 electrically connected with the electrode 14, as shown in FIG. 7. The interconnect 30 is formed to extend over the top portion of the resin protrusion 20. The interconnect 30 is formed to include the first portion 31 formed on the top surface of the resin protrusion 20 and the second portion 32 formed on the lower portion of the resin protrusion 20. The method of forming the interconnect 30 is not particularly limited. For example, the interconnect 30 may be formed by forming metal foil by sputtering and patterning the metal foil. In the step of patterning the metal foil, the interconnect 30 may be formed so that the second portion 32 has a width smaller than that of the first portion 31. In this step, the first and second portions 31 and 32 may be formed to contact the resin protrusion 20, as shown in FIG. 7. In this case, the first and second portions 31 and 32 may be secured to the resin protrusion 20.

The method of manufacturing a semiconductor device according to this embodiment may include partially removing a carbide layer formed on the surface of the resin protrusion 20 after the step of forming the interconnect 30. In this case, a portion of the carbide layer exposed from the interconnect 30 may be removed. This step may be performed using $O_2$ plasma, for example. The surface of the resin protrusion 20 faces almost the same direction as the semiconductor substrate 10 near the top portion of the resin protrusion 20. Therefore, the carbide layer formed on the surface of the top portion of the resin protrusion 20 can be efficiently and reliably removed by using $O_2$ plasma. In this step, at least part of the portion of the lower portion of the resin protrusion 20 which contacts the second portion 32 may be removed. This may create a state in which at least part of the second portion 32 is not secured to the resin protrusion 20 (see FIG. 1B). For example, the portion of the resin protrusion 20 which contacts the second portion 32 may be removed by utilizing an etchant (e.g. etching gas or liquid etchant). As described above, the second portion 32 has a width smaller than that of the first portion 31. Therefore, the etchant can reach the back side of the second portion 32. Specifically, the back side of the second portion 32 can be easily etched. Therefore, this method allows a highly reliable semiconductor device to be efficiently manufactured.

A step of cutting the semiconductor substrate 10, an inspection step, and the like may be then performed to obtain the semiconductor device 1.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. An electronic module comprising:
   a semiconductor device which controls the electronic module;
   a substrate including an electrode;
   a resin protrusion formed on the substrate; and
   an interconnect electrically connected to the electrode and formed to extend over the resin protrusion, the interconnect including a first portion formed on a top surface of the resin protrusion and a plurality of second portions formed on side surfaces of the resin protrusion that are lower than the top surface of the resin protrusion, and each of the second portions having a width smaller than a width of the first portion, and the first portion being located between the plurality of second portions.

2. The electronic module as defined in claim 1,
   wherein the interconnect includes an extension portion extending from one of the second portions, and a conductive portion connecting the extension portion and the electrode; and
   wherein the extension portion has a width smaller than a width of the conductive portion.

3. The electronic module as defined in claim 2, wherein the extension portion has a width equal to the width of the one of second portions.

4. The electronic module as defined in claim 1,
   wherein a portion of the interconnect formed on the substrate has a width equal to the width of the second portions.

5. The electronic module as defined in claim 1, wherein the second portions of the interconnect are not secured to the resin protrusion.

6. An electronic module comprising:
   a semiconductor device which controls the electronic module;
   a substrate;
   an electrode on the substrate;
   a resin protrusion on the substrate adjacent the electrode; and
   an interconnect electrically connected to the electrode and crossing over the resin protrusion, the interconnect including:
      a first portion on a surface of the resin protrusion, the first portion being spaced apart from the substrate by a pair of expanses along the surface of the resin protrusion; and
      a pair of second portions on the surface of the resin protrusion, the pair of second portions extending in opposite directions from the first portion and traversing the expanses along the surface of the resin protrusion to the substrate,
   each of the second portions being narrower than the first portion.

7. The electronic module as defined in claim 6, the interconnect further comprising:
   an extension portion on the substrate and extending from one of the second portions, and
   a conductive portion connecting the extension portion and the electrode;
   the extension portion being narrower than the conductive portion.

8. The electronic module as defined in claim 7, the extension portion having a width equal to a width of the one second portion.

9. The electronic module as defined in claim 6, the interconnect further comprising:
   an extension portion on the substrate and extending from one of the second portions, the extension portion having a width equal to a width of the one second portion.

10. The electronic module device as defined in claim 6, wherein the pair of second portions of the interconnect are not secured to the resin protrusion.

* * * * *